United States Patent
Op 'T Eynde (10) Patent No.: US 9,484,943 B2
(45) Date of Patent: Nov. 1, 2016

(54) DIGITAL-TO-ANALOG CONVERTER WITH INTEGRATED FIR FILTER

(76) Inventor: Frank Op 'T Eynde, Wilsele (BE)

( * ) Notice: Subject to any disclaimer, the term of this patent is extended or adjusted under 35 U.S.C. 154(b) by 10 days.

(21) Appl. No.: 14/345,518

(22) PCT Filed: Sep. 11, 2012

(86) PCT No.: PCT/BE2012/000043
§ 371 (c)(1),
(2), (4) Date: Mar. 18, 2014

(87) PCT Pub. No.: WO2013/040660
PCT Pub. Date: Mar. 28, 2013

(65) Prior Publication Data
US 2014/0355598 A1    Dec. 4, 2014

(30) Foreign Application Priority Data

Sep. 22, 2011 (EP) .................................... 11447022

(51) Int. Cl.
| | | |
|---|---|---|
| H03M 7/00 | (2006.01) | |
| H03M 1/06 | (2006.01) | |
| H03M 3/00 | (2006.01) | |
| H03M 1/66 | (2006.01) | |

(52) U.S. Cl.
CPC ......... *H03M 1/0626* (2013.01); *H03M 1/0612* (2013.01); *H03M 1/662* (2013.01); *H03M 3/504* (2013.01)

(58) Field of Classification Search
CPC .... H03M 1/0624; H03M 1/66; H03M 3/462; H03M 3/502; H03M 7/3033; H03M 1/0863; H03M 1/1215; H03M 1/46; H03M 3/506; H03M 7/3015
USPC ............................ 341/143, 144, 61, 146, 147
See application file for complete search history.

(56) References Cited

U.S. PATENT DOCUMENTS

| | | | |
|---|---|---|---|
| 4,468,794 A | | 8/1984 | Waters et al. |
| 5,008,674 A | * | 4/1991 | Da Franca .............. H03M 1/82 341/144 |
| 5,196,850 A | * | 3/1993 | Duffy .................. H03M 7/3015 341/143 |
| 5,512,895 A | * | 4/1996 | Madden et al. ................ 341/61 |
| 5,999,574 A | | 12/1999 | Sun et al. |
| 6,177,896 B1 | * | 1/2001 | Min ...................... H03M 3/504 341/143 |
| 6,531,973 B2 | * | 3/2003 | Brooks ................. H03M 3/502 341/118 |

(Continued)

FOREIGN PATENT DOCUMENTS

| | | |
|---|---|---|
| EP | 1 480 050 A2 | 11/2004 |
| EP | 1 487 111 A1 | 12/2004 |

OTHER PUBLICATIONS

Gaber, et al., "A CMOS IQ Direct Digital RF Modulator with Embedded RF FIR-Based Quantization Noise Filter", Proceedings of the European Solid-State Circuits Conference (ESSCIRC), pp. 139-142, (2011).

*Primary Examiner* — Linh Nguyen
(74) *Attorney, Agent, or Firm* — The Marbury Law Group, PLLC (57) ABSTRACT

A Digital-to-Analog Converter contains a digital shift register and a digital multiplexer. During each input signal clock period, the Digital-to-Analog Converter is multiplexed in time to perform multiple conversions on samples stored in the shift register. In this way, a weighted average of several signal samples is calculated, which corresponds to a FIR filter operation. Errors due! to Quantization Noise, INL or DNL undergo the same FIR filter characteristic.

18 Claims, 10 Drawing Sheets

Direct Digital RF Modulator with filtering of INL and DNL errors

(56) References Cited

U.S. PATENT DOCUMENTS

| | | | |
|---|---|---|---|
| 6,873,280 B2* | 3/2005 | Robinson | H03M 3/50 341/143 |
| 8,736,475 B1* | 5/2014 | Harrison | 341/143 |
| 8,773,297 B2* | 7/2014 | Kinyua | H03M 3/504 341/143 |
| 2011/0273317 A1* | 11/2011 | Nagatani et al. | 341/144 |

* cited by examiner

Fig. 1: Typical Digital-to-Analog Converter Quantisation Noise versus digital Wordlength Fig. 2a: Digital-to-Analog Converter with FIR Filter (1)

Fig. 2b: Digital-to-Analog Converter with FIR Filter (2)

Fig. 3: Digital-to-Analog Converter with filtering of INL and DNL errors

Fig. 4: Direct Digital RF Modulator with filtering of INL and DNL errors

Fig. 5: Timing diagram related to Fig. 4

Fig. 6: Signals "y" and "OUT" decomposed into the responses to the various samples of "x"

Fig. 7: FIR filter Impulse Response

Fig. 8: Filter Characteristic

Fig. 9: The response on "y" of perturbation (INL, DNL or Quantisation Noise) on sample $x_1$.
The signal perturbation on $x_1$ is indicated in black.

DIGITAL-TO-ANALOG CONVERTER WITH INTEGRATED FIR FILTER

FIELD OF THE INVENTION

This invention relates to the field of electrical signal treatment.

STATE OF THE ART

Digital-to-Analog Converters are widely used in the field of electrical signal treatment. In many devices, such as Compact Disk players, MP3-audio players or mobile phones, signals are treated in the digital domain. For this purpose, the signal is represented by a stream of digital words (each word containing a number of digital bits). At some point in the signal chain, the signal is converted from a digital representation to a "normal" analog representation by a Digital-to-Analog Converter.

Such a Digital-to-Analog Converter shows some inidealities that degrade the signal quality. Due to the finite number of bits in the digital words representing the signal, noise is added to the signal. This noise is known by the skilled professional as "Quantisation Noise". Increasing the number of bits in the digital words allows reducing the Quantisation Noise. In general, increasing the number of bits by one reduces the quantisation noise by 6 dB.

Figure 1:
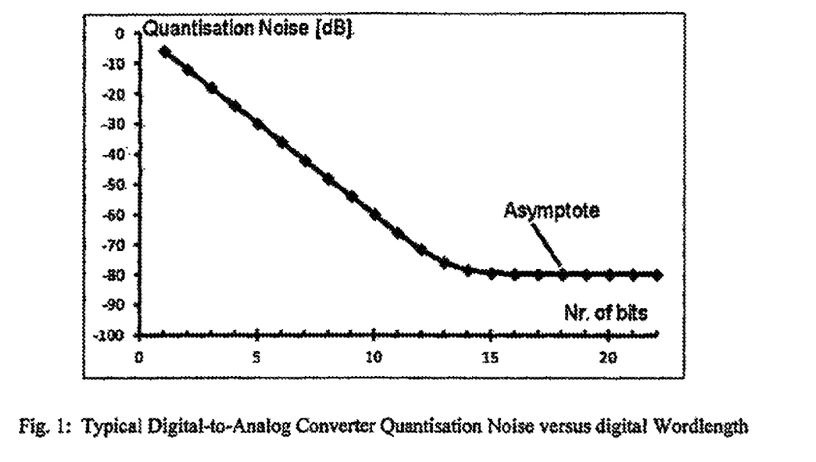
FIG. 1. shows the relation between the Quantisation Noise present in the output signal of an Digital-to-Analog Converter and the number of bits in the digital input words applied to this Converter. The asymptotic behaviour for high numbers of input bits is due to INL or DNL.

However, there is a limit to this trade-off between wordlength and Quantisation Noise. In general, the relation, between number of bits in the digital words representing the signal, and the Quantisation Noise, is as depicted in FIG. 1: when the number of bits is increased, the Quantisation Noise reaches an asymptotical minimum. In this situation, the "Least Significant Bits" are no longer meaningful.

Due to this effect, it is difficult to create Digital-to-Analog Converters with a very low Quantisation Noise. Lowering the Quantisation Noise of Digital-to-Analog Converters is a continuing process, and the state-of-the-art is advancing gradually year after year.

The asymptotic lower limit of the Quantisation Noise is determined by non-idealities inside the Digital-to-Analog Converter, well-known by the skilled professional as "Integral Nonlinearity" (INL) and/or "Differential Nonlinearity" (DNL). These are generally due to fabrication tolerances on electrical components inside the Digital-to-Analog Converter and are generally different for each fabricated Digital-to-Analog Converter sample (in other words, two identically fabricated Digital-to-Analog Converters show different errors due to INL or DNL).

In many situations, it is sufficient to lower the quantisation noise spectrum in a given frequency band of interest. Especially for some frequency bands outside the signal frequency band, the requirements for low-noise can be difficult to reach. For example, a GSM phone uses different radio frequency bands for transmitting signals and for receiving signals. When transmitting a GSM signal (in the frequency band designated for signal transmissions), there is a very stringent specification on the maximum amount of noise that can be transmitted in the frequency band designated for signal receptions. When this transmitted signal is converted from digital representation to analog representation by a Digital-to-Analog Converter, the Quantisation Noise of the Digital-to-Analog Converter can contribute to the noise produced in the frequency band designated for signal receptions, and hence must be very low.

In such situation, it could be advantageous, instead of using a Digital-to-Analog Converter with very low Quantisation Noise, to relax the specifications on the Quantisation Noise and to use a signal filter. Such a filter can attenuate the unwanted noise in the frequency band with stringent noise requirements while not significantly attenuating the wanted signal in its frequency band of interest.

Filtering an electrical signal is a well-known technique and numerous applications exist. The higher the signal frequency, the more difficult, and hence more expensive, it becomes to create accurate filters for analog signals. This explains why recent architectures for transmitting radio-frequency signals tend to reduce the requirements for radio-frequency filters.

Figure 2A:
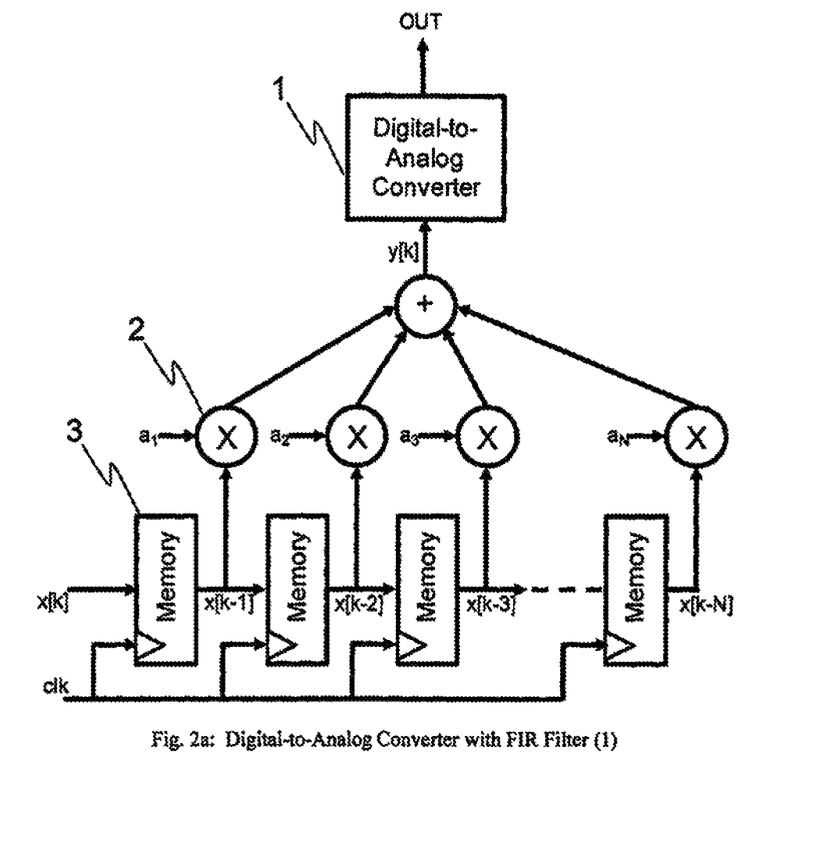
FIG. 2a shows a different implementation of a Finite Impulse Response filter.

It is possible to filter signals in the digital domain. A well-known type of digital signal filter is known by the skilled professional as a "Finite Impulse Response" filter (FIR). In such a filter, the last "N" digital words representing the signal (N being some integer number) are stored in N digital memories, (3) and a weighted sum is calculated:

$$y[k] = \sum_{i=1}^{N} a_i \cdot x[k-i] \qquad \text{(expr. 1)}$$

where at a given time instant "k", y[k] is the digital output word of the FIR filter and x[k−N] to x[k−1] are the N digital words at the filter input that are immediately preceding time instant "k". By properly choosing the coefficients (2) $\alpha_1$ to $\alpha_N$, a filter characteristic can be realised that attenuates signals in a chosen frequency band. A possible realisation of such a FIR filter with subsequent Digital-to-Analog Conversion (1) is depicted in FIG. 2a.

However, because the filtering takes place before the Digital-to-Analog Conversion, the Quantisation Noise inherent to the Digital-to-Analog Converter is not filtered out.

Figure 2B:
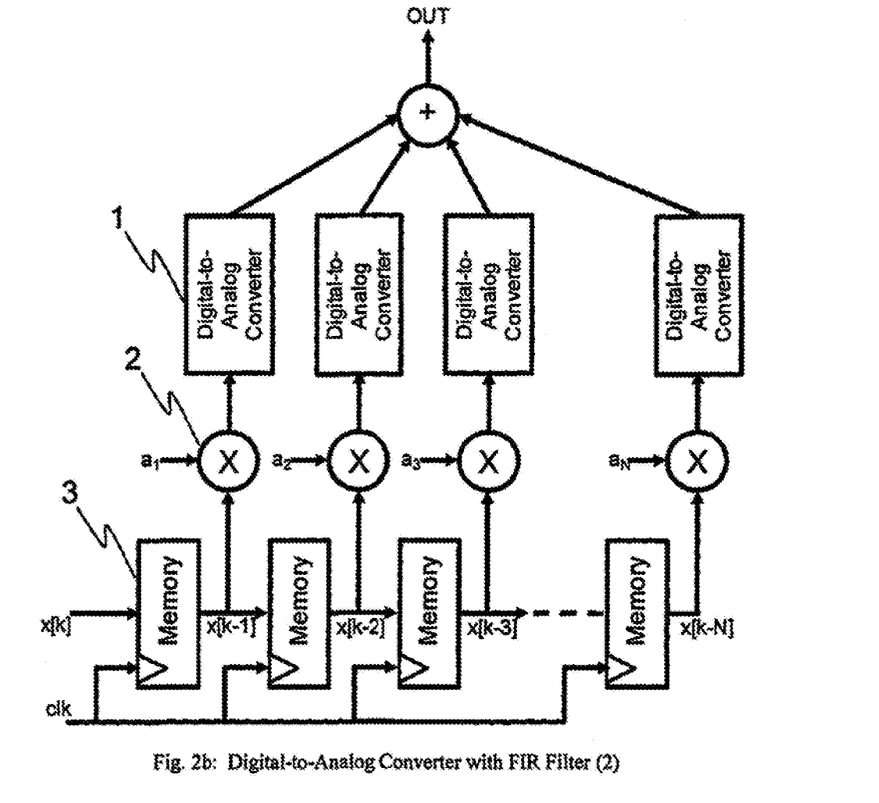
FIG. 2b shows another implementation of a Finite Impulse Response where the Quantisation Noise may be filtered, but not the noise due to INL or DNL.

An alternative approach is depicted in FIG. 2b. Here, each of the terms in expr. 1 is converted separately to an analog representation, and the sum is calculated in the analog domain. If all N Digital-to-Analog Converters (1) exhibit the same Quantisation Noise, this noise is filtered together with the signal, and hence, Quantisation Noise is attenuated in the frequency band with stringent noise requirements.

However, in general, the noise due to INL or DNL differs from Digital-to-Analog Converter to Digital-to-Analog Converter and hence, this noise is NOT filtered. As a result, Quantisation Noise can be attenuated by the circuit of FIG. 2b, down to the asymptotical limit shown in FIG. 1, but not below that level.

The presented invention aims at solving this last issue.

Recently, a class of Digital-to-Analog Converters, generally denoted as "Direct Digital RF modulators" (DDRM) or 'All-Digital Transmitters" emerged. Such a Digital-to-Analog Converter aims at generating a Radio-Frequency (RF) signal by combining the functions of Digital-to-Analog Converter and RF frequency Upconverter (also known as "mixer"). The Quantisation Noise principles and filtering techniques described above hold for this class of Digital-to-Analog Converters.

A DDRM incorporating a quantisation noise filter as depicted in FIG. 2b, was recently reported in "A CMOS IQ Direct Digital RF Modulator with Embedded FIR-Based Quantisation Noise Filter", European Solid-State Circuits Conference, September 2011, by W. M. Gaber et. al. It allows attenuation Quantisation Noise in a specific frequency band but is not reducing the noise due to INL or DNL.

The present invention aims at solving this last issue, also for Direct Digital RF modulators.

Aims of the Invention

The present invented aims at filtering the quantisation noise of an Digital-to-Analog Converter, including the noise due to INL and DNL.

An embodiment is described, where the invention is applied to a Direct Digital RF modulator, e.g. to be used in a GSM phone. The Quantisation Noise (including noise due to INL and DNL) transmitted in the frequency band intended for receiving signals is attenuated.

Principle of the Invention

Figure 3:
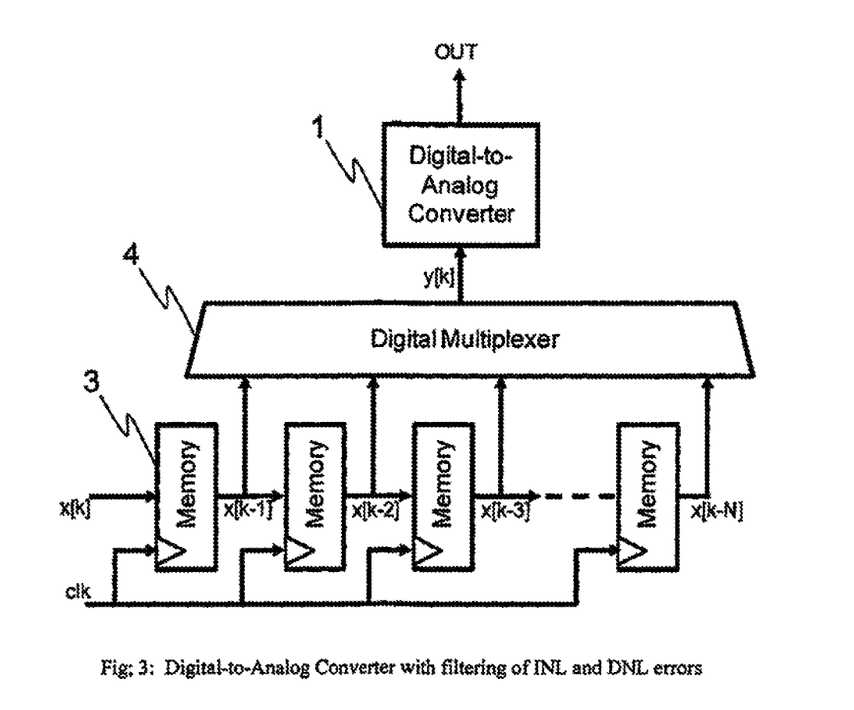
FIG. 3. shows a FIR filter realisation, allowing filtering also the errors due to INL or DNL.

The invention is mainly based on the following principles as shown in FIG. 3:

Let us start with the case where all coefficients $\alpha_1$ to $\alpha_N$ (2) in expr. 1 are all equal to unity. During each conversion cycle, the N digital signal samples of a FIR filter, as stored in digital memories (3), are applied rapidly, one after the other, to the same Digital-to-Analog Converter (1). This can be accomplished, for example, by means of a digital multiplexer (4). When the conversion Speed of the Digital-to-Analog Converter is fast enough, an output signal is created in this way with an average value corresponding to:

$$y[k] = \frac{1}{N}\sum_{i=1}^{N} a_i \cdot x[k-i] \quad \text{(expr. 2)}$$

This is identical to the result of expr. 1, except for a scaling factor.

In comparison with the circuit of FIG. 2b, this requires only one Digital-to-Analog Converter, with an N-times faster conversion speed. This one Digital-to-Analog Converter is multiplexed N times to create all N terms of expr. 2.

In this way, each input signal sample is used N times: It is applied N times to the same Digital-to-Analog Converter, once as first term of expr. 2, once as second term of expr. 2, etc. But because each time, the same Digital-to-Analog Converter is used to convert this input signal to an analog representation, the conversion suffers each time from an identical error due to INL or DNL. Hence, this error exhibits an attenuation due to the FIR filtering characteristic, identical to the attenuation of the signal. It is therefore possible to attenuate the noise due to INL and/or DNL in a given frequency band with stringent noise requirements.

More in general, it is also possible to apply each of the N input signal samples, as stored in the digital memories (3) of FIG. 3, more than once to the Digital-to-Analog Converter, during each conversion cycle. E.g. if each input signal sample is applied K times, one Digital-to-Analog Conversion cycle consists of N times K individual conversion cycles and hence, this required an Digital-to-Analog Converter with an N times K higher conversion speed.

In the case where all weighting coefficients $\alpha_1$ to $\alpha_N$ in expr. 2 are positive numbers with rational ratios (the word "rational" indicates that the ratios can be expressed as a division p/q, where p and q are positive integer numbers), these coefficients can be implemented by applying each input signal in expr. 2 a number of times to the Digital-to-Analog Converter of FIG. 3, this number of times being proportional to the corresponding weighting coefficient.

During each conversion, a given input signal sample suffers from a conversion error (due to quantisation noise including INL and DNL) that is proportional to its weighting coefficient. Again, the error is subject to the same filtering characteristic as the signal.

Negative values for the weighting coefficients coefficients $\alpha_1$ to $\alpha_N$ in expr. 2 can also be handled: during each conversion cycle, each input signal in expr. 2 is applied a number of times to the Digital-to-Analog Converter of FIG. 3, this number of times being proportional to the absolute value of the corresponding weighting coefficient, the output signal being inverted or not, depending on the sign of the weighting coefficient. Again, during each conversion, a given input signal sample suffers from a conversion error (due to quantisation noise including INL and DNL) that is proportional to its weighting coefficient. Hence, the error is subject to the same filtering characteristic as the signal.

These principles can be easily implemented in a Direct Digital RF modulator, because such modulator contains already clock signals with frequencies that are substantially larger than the baseband input signal frequencies.

SHORT DESCRIPTION OF THE DRAWINGS

Important timing characteristics are shown in FIG. 5.

For further clarification, in FIG. 6, the signals y[k] and OUT are decomposed into the contributions originating from the various input signal samples.

For further clarification.

The resulting filter frequency characteristic is drawn in FIG. 8.

For further clarification, in FIG. 9, the effect of an error (INL, DNL or Quantisation Noise) on sample $x_1$ is shown.

EMBODIMENT

Figure 4:
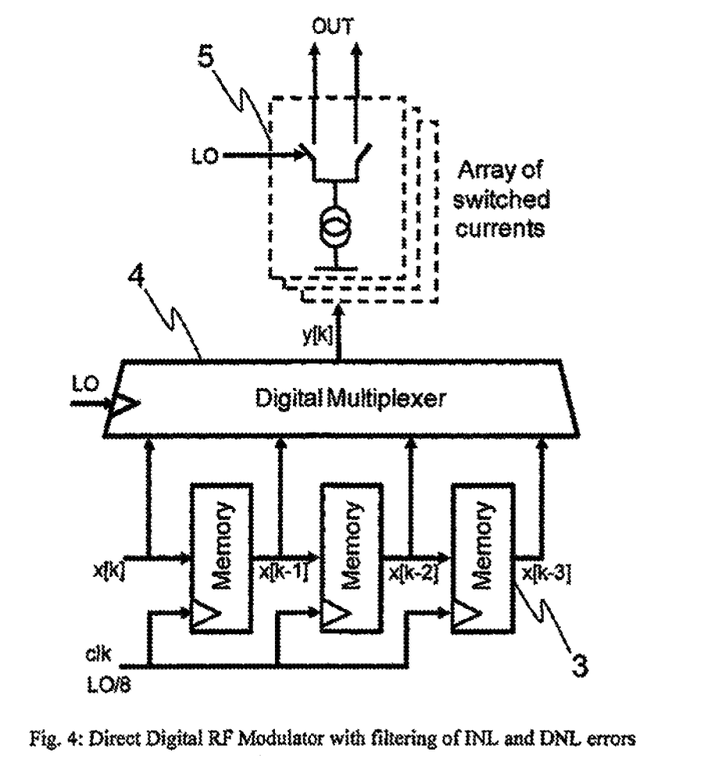
FIG. 4. shows an embodiment: a Direct Digital RF modulator with embedded FIR filter.

The principles of the invention described above can be successfully applied to a Direct Digital RF modulator (DDRM) e.g. for GSM applications. Such a DDRM is essentially a Digital-to-Analog Converter, as shown in FIG. 4, built e.g. with an array of switchable current sources (5). This can be an array of binary-weighted current sources, a thermometer-coded array or a combination of both. Each current source is equipped with a means to commutate the current, under control of a clock signal called "Local Oscillator". Hence, when the cell is selected, a square-wave output current with frequency $f_{LO}$ is generated ($f_{LO}$ being the Local Oscillator Clock frequency), otherwise the output current is zero. The individual cells are selected under control of a digital input signal "y[k]" in FIG. 4.

This principle is well-described in the literature and the skilled professional can understand that this circuit performs the functions of Digital-to-Analog Converter and RF upconversion mixer.

The circuit of FIG. 4 contains also a digital signal input "x[k]". This digital input signal is sampled with a clock frequency (curve 6 in FIG. 5), e.g. equal to $f_{LO}/8$. Four consecutive samples "x[k]" to "x[k−3]" are available from digital memories (3). From these digital signal samples, a second stream of samples "y[k]" is generated. This stream is clocked with clock frequency equal to $f_{LO}$. Hence, during one clock time interval of the signal stream x[k], eight signal samples y[k] are applied to the current sources array. These signal samples y[k] are respectively: x[k], x[k−1], x[k−2], x[k−3], x[k], x[k−1], x[k−2], x[k−3]. Such a stream of samples can be created from the four digital signals x[k] to x[k−3], by means of a digital multiplexer (4).

Figure 5:
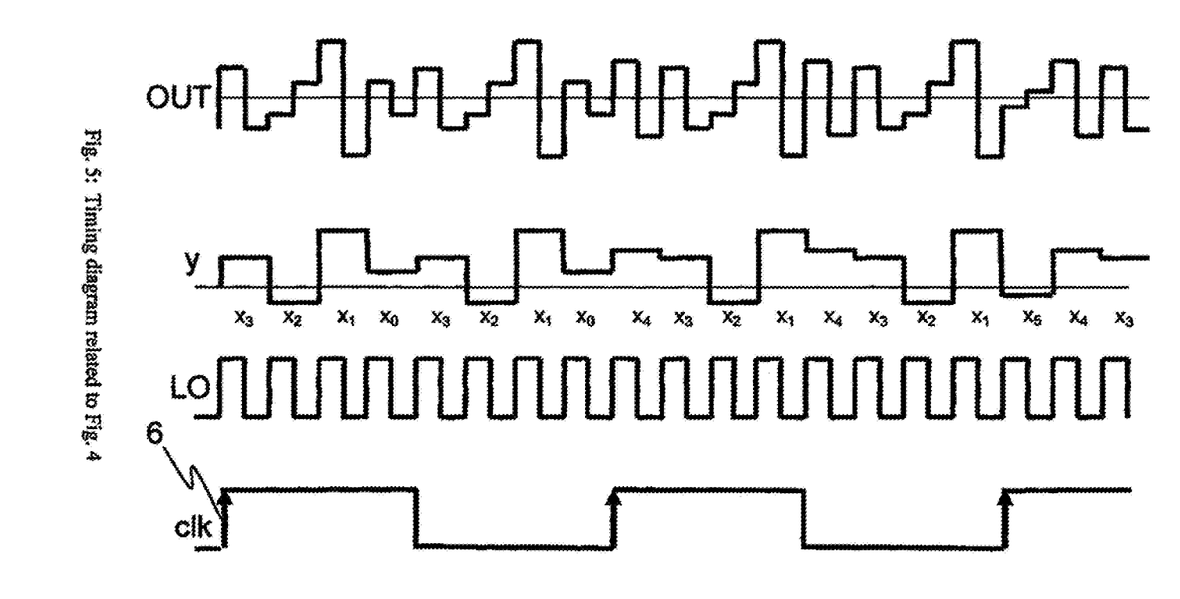

The timings of the different signals is detailed in FIG. 5.

Figure 6:
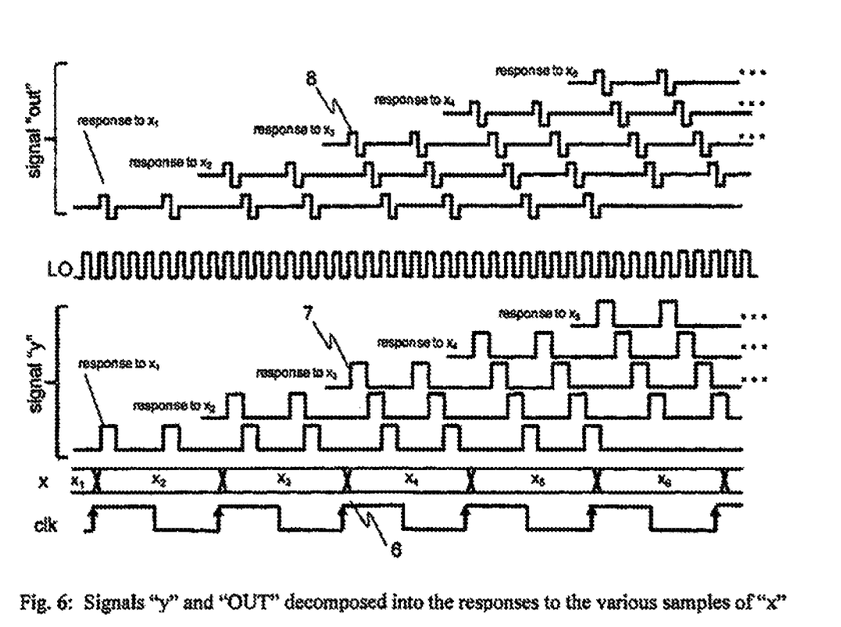

In order to further clarify the circuit operation, in FIG. 6, the signals y[k] and OUT are decomposed into the contributions originating from the various input samples (7 resp. 8).

Figure 7:
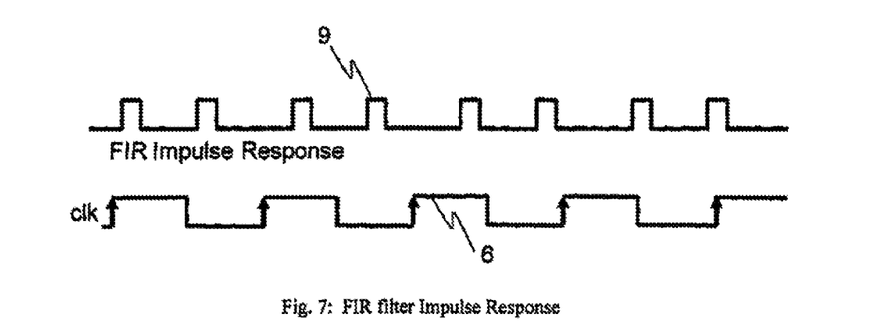
FIG. 7 shows the FIR filter Impulse Response.

It is obvious to the skilled professional that the FIR filter shows an impulse response (9) as depicted in FIG. 7. The corresponding frequency-domain filtering characteristic is given by the following expression (3):

$$|H(j\omega)| = \frac{1}{8}\left|(1 + e^{-9j\omega/f_{LO}}) \cdot (1 + e^{-18j\omega/f_{LO}}) \cdot (1 + e^{-4j\omega/f_{LO}}) \cdot \frac{\sin(\pi\omega/\omega_{LO})}{\pi\omega/\omega_{LO}}\right|$$

The last factor in expr. 3 is due to the hold-function embedded in any Digital-to-Analog Converter.

Figure 8:
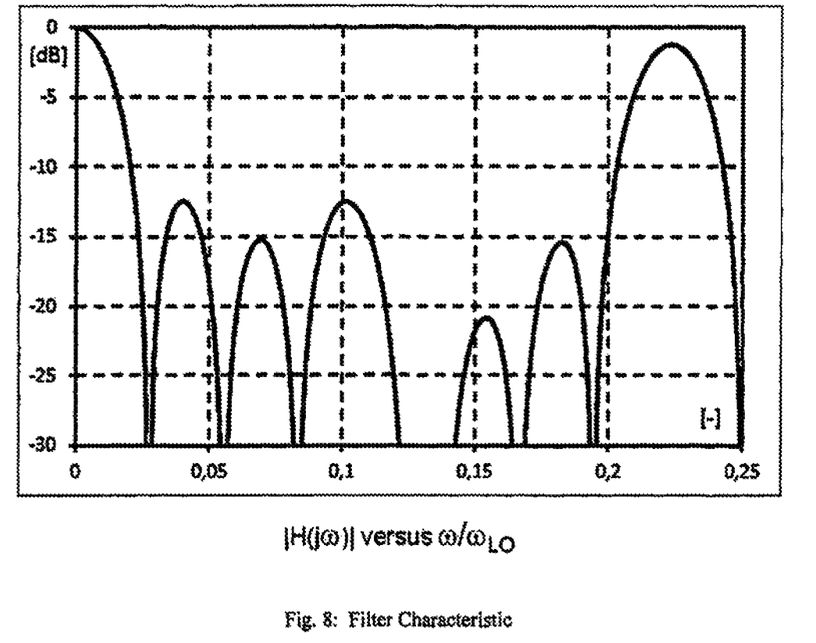

This filter characteristic is depicted in FIG. 8.

Figure 9:
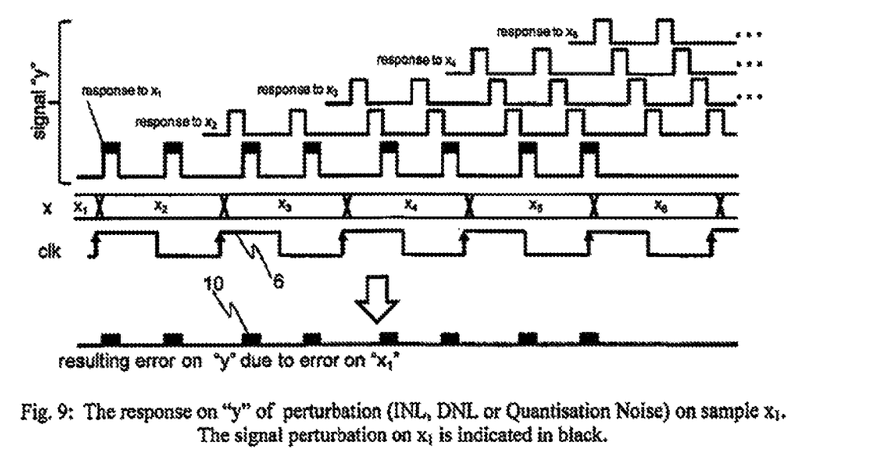

In order to further clarify the circuit operation: FIG. 9 demonstrates the effect of a perturbation (10) of signal sample $x_1$, due to Quantisation Noise, INL or DNL from the Analog-to-Digital Converter. This perturbation is present, each time this signal sample $x_1$ is applied to the Analog-to-Digital Converter. Hence, this signal perturbation is also subject to the filter's impulse response and therefore to the filter's frequency characteristic of expr. (3).

Because the filtered signal is mixed with the Local Oscillator in a Dual-Sideband mixer, the resulting output current shows a filtered spectrum that is symmetrical around the Local Oscillator frequency:

$$|H(j\omega)| = \frac{1}{8}|(1 + e^{-9j|\omega-\omega_{LO}|/f_{LO}}) \cdot (1 + e^{-18j|\omega-\omega_{LO}|/f_{LO}})| \cdot \qquad \text{(expr. 4)}$$
$$\left|(1 + e^{-4j|\omega-\omega_{LO}|/f_{LO}}) \cdot \frac{\sin(\pi|\omega - \omega_{LO}|/\omega_{LO})}{\pi|\omega - \omega_{LO}|/\omega_{LO}}\right|$$

Let us now further consider the example where the Local Oscillator frequency corresponds to a frequency in the band [890 MHz-915 MHz]. This is the GSM transmit band. From FIG. 8, it can be concluded that, in this case, signals or noise in the GSM receive band, [935 MHz-960 MHz], are attenuated by at least 12 dB.

It should be well understood that the drawings and embodiments presented in this document are given for explanatory purposes, and that other embodiments of the principles of the invention may exist.

It should also b understood that, although the embodiment described in this document is a DDRM, the principles can generally be applied to any Digital-to-Analog Converter.

Also, the principle of the time-interleaved FIR-filter of FIG. 3 can be combined with the principle of FIG. 2b: it is possible to build a circuit according to FIG. 2b, whereby the Digital-to-Analog Converters are constructed according to the principle of FIG. 3, or vice versa. The resulting two levels of filtering allow attenuating the quantisation noise even more.

The invention claimed is:

1. An apparatus for performing digital-to-analog conversion of a digital input signal, comprising:
   a first digital signal input to which the digital input signal is applied;
   a first clock signal line for providing a first clock frequency signal;
   a digital memory coupled to the first digital signal input and to the first clock signal line, wherein the digital memory comprises a plurality of digital memory units operable to store samples of the digital input signal and arranged in series, wherein, at a trigger of the first clock frequency signal, a new sample of the digital input signal is stored in a first of the plurality of digital memory units and at a subsequent trigger of the first clock frequency signal, the sample is transferred to a consecutive one of the plurality of digital memory units;
   a digital multiplexer comprising:
      a plurality of multiplexer inputs coupled to each one of the plurality of digital memory units; and
      a multiplexer output, wherein the digital multiplexer is configured for providing at the multiplexer output one of the multiplexer inputs at a time; and
   a digital-to-analog converter comprising a second digital signal input coupled to the digital multiplexer output, wherein the converter and the multiplexer are configured to operate at a second speed which is an integer multiple of the first clock frequency signal,
   wherein the digital memory and the digital multiplexer are configured for construing a second digital signal from the samples of the digital input signal stored in the digital memory, wherein the second digital signal comprises multiple identical occurrences of each of the samples of the digital input signal, and
   wherein the second digital signal is applied to the second digital signal input and is configured for being converted by the digital-to-analog converter.

2. The apparatus of claim 1, wherein at each trigger of the first clock frequency signal a new sample of the digital input signal is stored in a first digital memory unit of the plurality of digital memory unit.

3. The apparatus of claim 1, wherein the digital multiplexer is configured for consecutively providing at the digital multiplexer output samples stored in consecutive ones of the plurality of digital memory units.

4. The apparatus of claim 1, comprising a second clock signal line for providing a second clock frequency signal of higher frequency than the first clock frequency signal, the second clock signal line being coupled to the digital multiplexer and to the digital-to-analog converter, and wherein the digital-to-analog converter is operable for converting one of the samples per integer number of signal periods of the second clock frequency signal.

5. The apparatus of claim 4, comprising a radio frequency upconverter coupled to the digital-to-analog converter and operable to mix an output of the digital-to-analog converter with the second clock frequency signal.

6. The apparatus of claim 5, wherein the radio frequency upconverter is integrated in the digital-to-analog converter.

7. The apparatus of claim 4, wherein the digital-to-analog converter comprises an array of switchable current sources coupled to the second clock signal line, wherein the switchable current sources are operable to commutate a current under control of the second clock frequency signal.

8. A radio signal transmitter, comprising the apparatus of claim 1.

9. The radio signal transmitter of claim 8, operable on a GSM signal.

10. An apparatus for performing digital-to-analog conversion of a digital input signal, comprising:
   a first digital signal input to which the digital input signal is applied;
   a first clock signal line for providing a first clock frequency signal;
   a finite impulse response filter comprising a plurality of digital memory units arranged in series, the finite impulse response filter being coupled to the first digital input and to the first clock signal line, and comprising a digital signal output, wherein the finite impulse response filter is configured to collect samples of the digital input signal at a first sampling speed defined by the first clock frequency signal, wherein at a trigger of the first clock frequency signal, a new sample of the digital input signal is stored in a first of the plurality of digital memory units and at a subsequent trigger of the first clock frequency signal, the sample is transferred to a consecutive one of the plurality of digital memory units, and to provide output samples at the digital signal output at a second sampling speed that is an integer multiple of the first sampling speed;
   a digital-to-analog converter comprising a second digital signal input coupled to the digital signal output, wherein the converter is configured to operate at the second sampling speed, such that a plurality of the output samples are converted by the digital-to-analog converter between one period of the first sampling speed,
   wherein the finite impulse response filter is configured for construing a second digital signal from the samples of the digital input signal, wherein the second digital signal comprises multiple identical occurrences of each of the samples of the digital input signal, and wherein the second digital signal is applied to the second digital signal input.

11. The apparatus of claim 10, wherein the finite impulse response filter is configured with all filter coefficients equal to either unity, minus unity, or zero.

12. The apparatus of claim 10, comprising a second clock signal line for providing a second clock frequency signal of higher frequency than the first clock frequency signal, the second clock signal line defining the second sampling speed, and wherein the digital-to-analog converter is operable for converting one of the output samples per integer number of signal periods of the second clock frequency signal.

13. The apparatus of claim 12, comprising a radio frequency upconverter coupled to the digital-to-analog converter and operable to mix an output of the digital-to-analog converter with the second clock frequency signal.

14. The apparatus of claim 13, wherein the radio frequency upconverter is integrated in the digital-to-analog converter.

15. The apparatus of claim 12, wherein the digital-to-analog converter comprises an array of switchable current sources coupled to the second clock signal line, wherein the switchable current sources are operable to commutate a current under control of the second clock frequency signal.

16. A radio signal transmitter, comprising the apparatus of claim 10.

17. The radio signal transmitter of claim 16, operable on a GSM signal.

18. A method of performing digital-to-analog conversion of a digital input signal, comprising:
   taking samples of the digital input signal at a first sampling speed,
   storing a plurality of the samples in a plurality of digital memory units, wherein the plurality of digital memory units are arranged in series and each sample is shifted through the series at the first sampling speed,
   construing a second digital signal from the plurality of samples, wherein the second digital signal comprises multiple identical occurrences of each of the plurality of samples,
   applying the second digital signal sequentially to a digital-to-analog converter, and
   wherein the second digital signal is converted by the digital-to-analog converter at a conversion speed which is an integer multiple of the first sampling speed.

* * * * *